(12) United States Patent
Ogawa

(10) Patent No.: US 6,885,099 B2
(45) Date of Patent: Apr. 26, 2005

(54) MULTICHIP MODULE, MANUFACTURING METHOD THEREOF, MULTICHIP UNIT AND MANUFACTURING METHOD THEREOF

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/691,382

(22) Filed: Oct. 22, 2003

(65) Prior Publication Data

US 2004/0150081 A1 Aug. 5, 2004

(30) Foreign Application Priority Data

Oct. 24, 2002 (JP) .................................... P2002-309978

(51) Int. Cl.[7] .............................................. H01L 23/53
(52) U.S. Cl. ...................... 257/701; 257/702; 257/81; 257/99
(58) Field of Search ........................ 257/81, 99, 431, 257/432, E33.076, E31.105, 31.106, E31.127, E25.032, 701, 702, 778, 787

(56) References Cited

U.S. PATENT DOCUMENTS

| | | | | |
|---|---|---|---|---|
| 5,362,976 A | * | 11/1994 | Suzuki ......................... | 257/81 |
| 6,121,675 A | * | 9/2000 | Fukamura et al. .......... | 257/680 |
| 6,605,828 B1 | * | 8/2003 | Schwarzrock et al. ....... | 257/81 |
| 6,617,702 B1 | * | 9/2003 | Hsu et al. ................... | 257/797 |
| 2004/0214380 A1 | * | 10/2004 | Leib et al. .................. | 438/151 |

* cited by examiner

Primary Examiner—Jasmine Clark
(74) Attorney, Agent, or Firm—Sonnenschein, Nath & Rosenthal LLP

(57) ABSTRACT

Reduction of parasitic capacitance originated between semiconductor chip and optical chip by reducing the connection distance thereof by means of interlayer-connecting the semiconductor chip mounted on a surface of a resin layer and the optical chip buried on another surface of the resin layer with an interlayer via.

7 Claims, 19 Drawing Sheets

MULTICHIP MODULE, MANUFACTURING METHOD THEREOF, MULTICHIP UNIT AND MANUFACTURING METHOD THEREOF

CROSS REFERENCE TO RELATED APPLICATIONS

The present document is based on Japanese Priority Application JP2002-309978, filed in the Japanese Patent Office on Oct. 24, 2002, the contents of which being incorporated herein by reference to the extent permitted by law.

BACKGROUND OF THE INVENTION

1. Field of the Invention

The present invention relates to a multichip module having an electric chip and an optical chip for performing increased transmission speed of information signals, and a method of manufacturing the multichip module. Also, the present invention relates to a multichip unit equipped with the multichip module and having an optical transmission line adapted to interconnect optical chips within the multichip module, and a method for manufacturing the multichip unit.

2. Description of the Related Art

In recent years, performance of microprocessors and capacity of memory chips have been sharply increasing with increasing operation speed and integration level of integrated circuits, thanks to technological advancements in integrated circuit chips such as IC (Integrated Circuit) chips and LSI (Large Scale Integration) chips. With the above integrated circuit chips mounted on a circuit substrate, inter-chip transmission of information including relatively short distance-transmission is performed using an electric signal.

As for further increasing performance of the integrated circuit chips, transmission speed of a signal exchanged between the chips needs to be increased, with demands for increased density of the electric signal, in other words, an electric interconnect.

However, in the circuit substrate, there is a limit for electric interconnect density, and signal delay caused by a CR (Capacitance-Resistance) time constant of the electric interconnect becomes an issue for consideration. In addition, in the circuit substrate, increasing speed of the electric signal and/or increasing density of the electric interconnect leads to development of unacceptable conditions such as EMI (Electromagnetic Interference) noise and inter-channel cross talk, for instance, so that measures against these inconvenient conditions are also necessary.

As one of approaches to settlement of the above problems, there is proposed a technology, which permits that an optical interconnect such as photo signal interconnect and optical interconnection is adapted to inter-electronic appliance, inter-circuit substrate, and inter-chip connections and so on. In particular, short-distance transmission such as inter-chip transmission of information requires that an optical transmission/communication system is configured with an optical wave-guide, which is effective in propagation of light due to total reflection, as a transmission line by forming the optical wave-guide between the chips mounted to the circuit substrate.

Thus-configured optical transmission/communication system employs a multichip unit having a circuit substrate or the like mounted with chips such as an optical chip having a light emitting section for converting an electric signal into a photo signal and/or a photo detecting section for converting the photo signal into the electric signal; and an electric chip such as IC chip and LSI chip adaptable to electric signal processing such as operational processing.

A hybrid circuit substrate having not only the above optical wave-guide but also a patterned interconnect or the like on the circuit substrate is to be employed for the multichip unit, because of needs for feed of power to the optical chip and the electric chip and/or various control signal transmission with the electric signal, for instance.

Specifically, the multichip unit employs a hybrid circuit substrate having the patterned interconnect deposited on a surface of a silicon or glass substrate using a thin film deposition technology or the like, with the optical wave-guide thereon as an optical interconnect, for instance. Alternatively, a different type of hybrid circuit substrate such as one having the optical wave-guide as the optical interconnect on a surface of an existing printed circuit board is also available. In the above hybrid circuit substrate, the optical wave-guide configured as the optical interconnect is to be formed using a low-temperature process with a polymer compound as an optical wave-guide material, for instance.

In the multichip unit, the optical chip for converting the electric signal inputted to or outputted from the electric chip into the photo signal is required for inter-packaged electric chip transmission of information with the optical interconnect. Specifically, the multichip unit requires an optical chip having, at an output side of the electric signal from the electric chip, a light emitting device such as a semiconductor laser and a light emitting diode for converting an outputted electric signal into the photo signal to emit light as the photo signal and/or an optical chip having, at an input side of the electric signal to the electric chip, a photo detecting device such as a photo detector for detecting the photo signal having been passed through the optical interconnect to convert thus-detected photo signal into the electric signal.

Specifically, in the multichip unit, the electric signal from the electric chip is applied to the light emitting device to ensure that the light emitting device converts the applied electric signal into the photo signal for emission of light, which is then allowed to propagate through the optical wave-guide or the like. Then, the photo signal having been passed through the optical wave-guide or the like is detected by the photo detecting device to ensure that the photo detecting device converts the detected photo signal into the electric signal, which is then allowed to enter the electric chip.

SUMMARY OF THE INVENTION

However, under the conventional multichip unit, placement of the hybrid patterned interconnect and the optical interconnect in the hybrid circuit substrate requires complex electric connection between the electric chip and the optical chip, and hence, causes an increase in parasitic capacitance generated by the electric connection between the electric chip and the optical chip.

In addition, in the above multichip unit, the hybrid placement of the patterned interconnect and the optical interconnect also leads to limitations to downsizing.

Further, in the above multichip unit, complexity of the hybrid placement of the patterned interconnect and the optical interconnect also gives rise to a problem such as yield reductions in manufacture.

Accordingly, there is a need to provide a multichip module, which achieves not only a reduction of parasitic capacitance generated by electric connection between an electric chip and an optical chip, but also increased yield in manufacture, with the electric chip and the optical chip packaged. Also, there is a need to provide a method for manufacturing the multichip module. Further, there is a need to provide a multichip unit having the multichip module and a method for manufacturing the multichip unit as well.

A multichip module according to a preferred embodiment of the present invention comprises a circuit section having an insulating layer, a patterned interconnect having connection lands on first and second surfaces of the insulating layer and interlayer via adapted to electric interlayer connection between the connection lands on both the above surfaces; an electric chip having connection terminals connected to the connection lands, and being mounted on one of the first surfaces of the insulating layer with the connection terminals connected to the connection lands to ensure processing on an electric signal outputted or inputted through the interlayer via; and an optical chip having a terminal section connected through the interlayer via to the connection land with the connection terminal connected thereto, also with a light emitting section and/or a photo detecting section on a surface, and being buried in the insulating layer with the above surface flush with one of the second surfaces of the insulating layer to ensure that the light emitting section and/or a photo detecting section is in a bared state on the second surface of the insulating layer.

In the multichip module according to the preferred embodiment of the present invention, the electric interlayer connection between the electric chip mounted on the first surface of the insulating layer and the optical chip buried in the second surface of the insulating layer is attained through the interlayer via, so that there is an advantage that the electric connection between the electric chip and the optical chip is shortened and also simplified to ensure a reduction of parasitic capacitance generated by the connection between the electric chip and the optical chip.

According to the multichip module of the preferred embodiment of the present invention, there is also an advantage that the shortened and simplified electric connection between the electric chip and the optical chip permits downsizing and increased transmission speed of the electric signal exchanged between the electric chip and the optical chip.

According to the multichip module of the preferred embodiment of the present invention, mounting of the multichip module to the base substrate, for instance, takes place with the optical chip buried in the insulating layer so as to ensure that the surface of the optical chip coincides with the second surface of the insulating layer, so that there is also an advantage that the multichip module is mounted to the base substrate or the like easily in a proper manner with the second surface of the insulating layer as a component side.

A multichip module manufacturing method according to another preferred embodiment according to a preferred embodiment of the present invention comprises forming a circuit section having an insulating layer and a patterned interconnect having connection lands formed on first and second surfaces of the insulating layer; mounting an electric chip having connection terminals connected to the connection lands on one of the first surfaces of the insulating layer with the connection terminals connected to the connection lands; burying an optical chip having a terminal section constituting an electric signal input/output section and a light emitting section and/or a photo detecting section formed on a surface thereof in the insulating layer with the surface coinciding with one of the second surfaces of the insulating layer so that the light emitting section and/or the photo detecting section is exposed on the second surface of the insulating layer; and forming an interlayer via on the circuit section for performing interconnecting the connection lands formed on both surfaces of the insulating layer, and electrically interlayer connecting the connection lands and a terminal section of the optical chip.

According to the multichip module manufacturing method according to the preferred embodiment of the present invention, the electric interlayer connection between the electric chip mounted on the first surface of the insulating layer and the optical chip buried in the second surface of the insulating layer is attained through the interlayer via, so that there is an advantage that the electric connection between the electric chip and the optical chip is shortened and also simplified to ensure a reduction of parasitic capacitance generated by the connection between the electric chip and the optical chip.

According to the multichip module manufacturing method of the preferred embodiment of the present invention, there is also an advantage that the shortened and simplified electric connection between the electric chip and the optical chip permits downsizing and increased transmission speed of the electric signal exchanged between the electric chip and the optical chip.

A multichip unit according to still another preferred embodiment of the present invention comprises: a multichip module including a circuit section having an insulating layer, a patterned interconnect having connection lands formed on first and second surfaces of the insulating layer and an interlayer via for electrically interlayer connect the connection lands formed on one of the first and second surfaces of the insulating layer; an electric chip having connection terminals connected to the connection lands, and mounted on one of the first surface of the insulating layer with the connection terminals connected to the connection lands for processing an electric signal inputted and/or outputted through the interlayer via; and an optical chip having a terminal section connected through the interlayer via to the connection land with the connection terminal connected thereto, having a light emitting section and/or a photo detecting section formed on a surface thereof and buried in the insulating layer with the surface coinciding with the second surface of the insulating layer so that the light emitting section and/or the photo detecting section is exposed on the second surface of the insulating layer; and anoptoelectrical interconnect layer comprising: an optical transmission line formed on the second surface of the insulating layer of the multichip module, for optically connecting the light emitting section and the photo detecting section exposed on the second surface of the insulating layer; and a via electrically connected with the connection land of the multichip module.

According to such multichip unit of the preferred embodiment of the present invention, the optical connection between optical chips of the multichip module is carried out by the optical transmission line of theoptoelectrical interconnect layer, so that downsizing is made possible and production yield is improved as the interconnect paths are simplified, since the patterned interconnects and the optical lines at the multichip module side are not mixed in the multichip module having the electric chip and the optical chip.

According to such multichip unit of the preferred embodiment of the present invention, it is possible to reduce the parasitic capacitance originated in the connection between electric chip and optical chip as the connection thereof is shortened and simplified, since the electric chip at the multichip module side and the optical chip are electrically interlayer connected with the interlayer via.

Furthermore, according to such multichip unit of the preferred embodiment of the present invention, it is possible to improve the accuracy of the formation of the optical transmission line, the connection vias and the like in the process of forming theoptoelectrical interconnect layer on the second surface of the insulating layer, by burying optical chip in the insulating layer so as to make the surface of the optical chip and the second surface of the insulating layer coincide.

A multichip unit manufacturing method according to still another preferred embodiment of the present invention comprises: a multichip module forming process comprising the steps of forming a circuit section having an insulating layer and a patterned interconnect having connection lands formed on first and second surfaces of the insulating layer; mounting an electric chip having connection terminals connected to the connection lands on one of the first surfaces of the insulating layer with the connection terminals connected to the connection lands; burying an optical chip having a terminal section constituting an electric signal input/output section and a light emitting section and/or a photo detecting section formed on a surface thereof in the insulating layer with the surface coinciding with one of the second surfaces of the insulating layer so that the light emitting section and/or the photo detecting section is exposed on the second surface of the insulating layer; and forming an interlayer via on the circuit section for performing interconnecting the connection lands formed on both surfaces of the insulating layer, and electrically interlayer connecting the connection lands and a terminal section of the optical chip; and an optoelectrical interconnect layer forming process comprising the steps of: forming an optical transmission line on a second surface of the insulating layer of the multichip module, for optically connecting the light emitting section and the photo detecting section exposed on the second surface of the insulating layer; and forming a via electrically connected with the connection land of the multichip module.

According to the multichip unit manufacturing method according to the preferred embodiment of the present invention, the optical connection between optical chips of the multichip module is carried out by the optical transmission line of the optoelectrical interconnect layer, so that downsizing is made possible and production yield is improved as the interconnect paths are simplified, since the patterned interconnects and the optical lines at the multichip module side are not mixed in the multichip module having the electric chip and the optical chip.

According to such multichip unit manufacturing method of the preferred embodiment of the present invention, it is possible to manufacture the multichip unit with reduced parasitic capacitance originated in the connection between electric chip and optical chip as the connection thereof is shortened and simplified, since the electric chip at the multichip module side and the optical chip are electrically interlayer connected with the interlayer via.

Furthermore, according to such multichip unit manufacturing method of the preferred embodiment of the present invention, it is possible to manufacture the multichip unit by improving the accuracy of the formation of the optical transmission line, the connection vias and the like in the process of forming the optoelectrical interconnect layer on the second surface of the insulating layer, by burying optical chip in the insulating layer so as to make the surface of the optical chip and the second surface of the insulating layer coincide.

BRIEF DESCRIPTION OF THE DRAWINGS

The above and other features and advantages of the present invention will become more apparent from the following description of the presently exemplary preferred embodiment of the present invention taken in conjunction with the accompanying drawings, in which.

DETAILED DESCRIPTION OF PREFERRED EMBODIMENTS OF THE INVENTION

Figure 1:
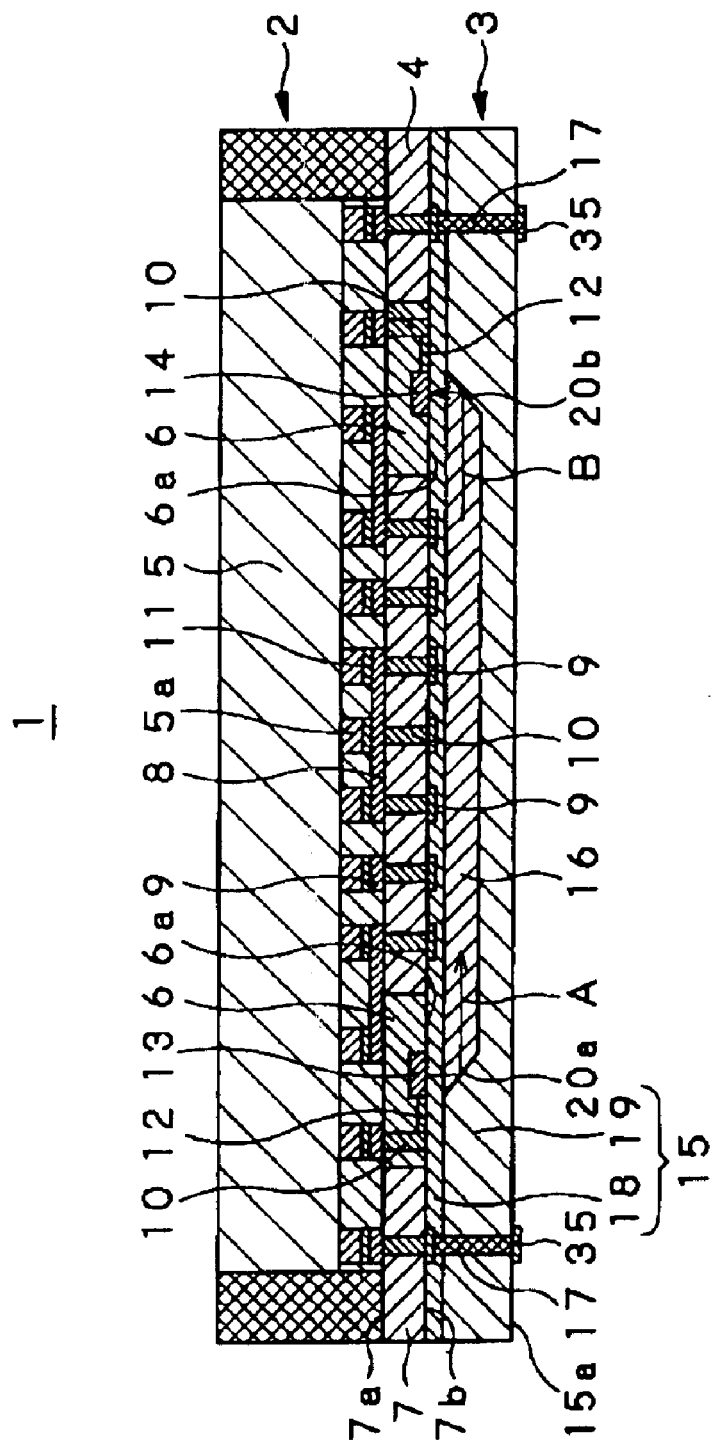
FIG. 1 is a schematic cross-sectional view showing a first example of multichip unit according to a preferred embodiment of the present invention.

Preferred embodiments of the present invention will now be described in detail with reference to the accompanying drawings. FIG. 1 shows a multichip unit 1 obtained by application of a preferred embodiment of the present invention. The multichip unit 1 comprises an optoelectric hybrid chip-size packaged (CSP) multichip module 2 applicable to attain increased transmission speed of an information signal and an optoelectric interconnect layer 3 electrically and optically connected to the multichip module 2.

The multichip module 2 comprises a circuit section 4, a semiconductor chip 5 packaged with the circuit section 4 as a base and an optical chip 6 electrically connected to the semiconductor chip 5.

The circuit section 4 has a resin layer 7 including a material such as resin, connection lands 9 configuring a section of a patterned interconnect 8 on a first surface 7a and a second surface 7b of the resin layer 7 and interlayer vias 10 each extending through the resin layer 7 from the first surface 7a to the second surface 7b.

The resin layer 7 in the circuit section 4 is formed with insulating resin such as polyphenylene-ether (PPE), bismaleido-triazine (BT) resin, liquid crystal polymer (LCP), polynorbornane (PNB), polyimide, benzocyclobutene (BCB), epoxy resin and acrylic resin, for instance.

The patterned interconnect 8 and the connection lands 9 are formed by patterning with conductive metal such as copper and gold on both the surfaces 7a and 7b of the resin layer 7 using a thin film deposition technology, for instance.

Each of the interlayer vias 10 consists of conductive metal such as copper, for instance, and is adapted to electric interlayer connection between the connection lands 9 on both the surfaces 7a and 7b of the resin layer 7 and/or between the optical chip 6 and the connection land 9 with the semiconductor chip 5 connected thereto. With the above electric interlayer connection, transmission of an electric signal between the semiconductor chip 5 and the optical chip 6 takes place through the interlayer vias 10.

The semiconductor chip 5 employs an integrated circuit chip such as IC chip and LSI chip that is mounted on the first surface 7a of the resin layer 7 and performs processing such as operational processing on an information signal accepted as an electric signal to ensure that the information signal is outputted as the electric signal to the outside. Specifically, the semiconductor chip 5 has connection terminals 5a configuring electric signal input/output sections, and is mounted on the first surface 7a of the resin layer 7 in such a way that the connection terminals 5a are connected through connection bumps 11 to the connection lands 9 on the first surface 7a of the resin layer 7.

The optical chip 6 has a terminal section 12 adapted to input/output of the electric signal, with a light emitting section 13 for emission of light and/or a photo detecting section 14 for detection of light on a surface 6a thereof. The optical chip 6 with the light emitting section 13 thereon functions as a light-emitting device, while one with the photo detecting section 14 thereon functions as a photo-detecting device. Alternatively, the optical chip 6 may be an optical element having both the light emitting section 13 and the photo detecting section 14. Specifically, for the optical chip 6, examples of the light emitting device having the light emitting section 13 include a semiconductor laser and a light emitting diode or the like, and examples of the photo detecting device having the photo detecting section 14 include a photo detector or the like.

The optical chip 6, when being to function as the light-emitting device, converts the electric signal accepted through the terminal section 12 into the photo signal so as to allow light to be emitted as the photo signal through the light emitting section 13. On the contrary, the optical chip 6, when being to function as the photo-detecting device, converts the photo signal detected by the photo detecting section 14 into the electric signal so as to allow thus-converted electric signal to be outputted through the terminal section 12.

The optical chip 6 is buried in the resin layer 7 so as to ensure that the surface 6a mounted with the light emitting section 13 and/or the photo detecting section 14 thereon coincides with the second surface 7b of the resin layer 7. With this configuration, the light emitting section 13 and/or the photo detecting section 14 becomes bared on the second surface 7b of the resin layer 7, so that the optical chip 6 permits that the optical interconnect such as photo signal interconnect and optical interconnection is formed easily on the second surface 7b, and the simplified optical interconnect is connected to the light emitting section 13 and the photo detecting section 14.

The optical chip 6 is buried in a thickness direction of the resin layer 7 within an area with the semiconductor chip 5 projected. With this configuration, the multichip module 2 may be chip-size packaged to ensure downsizing.

In thus-configured multichip module 2, substantially short distance interlayer connection between the semiconductor chip 5 mounted on the first surface 7a of the resin layer 7 and the optical chip 6 buried in the second surface 7b is attained through the interlayer vias 10, so that parasitic capacitance generated by the connection between the semiconductor chip 5 and the optical chip 6 may be reduced.

In addition, in the multichip module 2, reduced parasitic capacitance between the semiconductor chip 5 and the optical chip 6 permits an increase in transmission speed of the electric signal exchanged between the semiconductor chip 5 and the optical chip 6.

Further, the multichip module 2 is fabricated in such a way that the resin layer 7 deposited on an accurately planarized surface 30a of a dummy substrate 30 through a release layer 31 is removed from the dummy substrate 30 together with the release layer 31, as will be detailed later. Thus, the multichip module 2 also permits that the patterned interconnect 8 and the connection lands 9 formed using the thin film deposition technology and/or the interlayer vias 10 extending through the resin layer 7 are provided at accuracy.

The multichip module 2 shown in FIG. 1 has the circuit section 4 configured with the resin layer 7 of a single layer structure as a base. Alternatively, the circuit section 4 may be also modified so that the resin layer 7 and the patterned interconnect 8 and the connection lands 9 respectively on both the surfaces 7a and 7b of the resin layer 7 are of a multi-layer structure. In this case, it is also allowable to provide the circuit section 4 having passive elements such as a capacitor and an inductor, for instance, in a section of the patterned interconnect 8.

The optoelectric interconnect layer 3 will next be described. The optoelectric interconnect layer 3 is deposited on the second surface 7b of the resin layer 7 in the multichip module 2, and has a cladding layer 15 configuring a base, an optical interconnect core 16 configuring an optical transmission line and connection vias 17 extending through the cladding layer 15 in a thickness direction.

The cladding layer 15 is of a double-layer structure composed of a lower cladding layer 18 deposited on the second surface 7b of the resin layer 7 in the multichip module 2 and an upper cladding layer 19 deposited on the lower cladding layer 18. The cladding layer 15 is formed with a material such as a polymeric resin material and an inorganic material inclusive of glass and silica, for instance. In the cladding layer 15, the lower cladding layer 18 and the upper cladding layer 19 preferably need to be formed with the same material reliable on mutual adhesion and stress relaxation using a process at a low temperature that causes no damage to the multichip module 2.

The optical interconnect core 16 is configured so that one end thereof faces the bared light emitting section 13 of the optical chip 6 on the second surface 7b of the resin layer 7 in the multichip module 2, and the other end faces the bared photo detecting section 14 of the optical chip 6 on the above second surface 7b. The optical interconnect core 16 is enclosed with the cladding layer 15 in such a way as to be sandwiched between the lower cladding layer 18 and the upper cladding layer 19.

The optical interconnect core 16 is formed in a ridge or slab shape with a resin material such as polyimide resin, a epoxy resin, acrylic resin, polyolefin resin and rubber resin having a refractive index larger than that of the above cladding layer 15, for instance. With this configuration, the optical interconnect core 16 enclosed with the material of a smaller refractive index is applicable to an optical waveguide that is effective in propagation of the photo signal to be guided due to total reflection.

In addition, the optical interconnect core 16 has mirror sections 20a and 20b at the opposite ends thereof. In the optical interconnect core 16, the mirror section 20a at one end allows the photo signal emitted by the light emitting section 13 to be reflected in a direction substantially parallel to the optoelectric interconnect layer 3 as shown by an arrow A in FIG. 1. On the contrary, the mirror section 20b at the other end allows the accepted photo signal to be reflected in a direction substantially perpendicular to the optoelectric interconnect layer 3 as shown by an arrow B in FIG. 1. With this configuration, the optical interconnect core 16 permits that the photo signal emitted by the light emitting section 13 of the optical chip 6 in the multichip module 2 is allowed to propagate to the photo detecting section 14 of the optical chip 6.

Thus-configured optoelectric interconnect layer 3 may be also modified so that the cladding layer 15 is of a multi-layer structure having an interlayer patterned interconnect or the like formed by patterning, similarly to the above circuit section 4. In this case, it is also allowable to provide the patterned interconnect having the passive elements, for instance.

In thus-configured multichip unit 1, the optical connection between the light emitting section 13 and the photo detecting section 14 in the optical chips 6 of the multichip module 2 is attained through the optical interconnect core 16 of the optoelectric interconnect layer 3, differently from a conventional multichip unit needing the hybrid placement of the patterned interconnect and the optical interconnect, so that placement and routing of the patterned interconnect 8 and/or the optical interconnect core 16 may be simplified to ensure increased yield in manufacture.

In addition, in the multichip unit 1, the semiconductor chip 5 and the optical chip 6 are packaged into a single chip in the multichip module 2 to ensure that the multichip unit 1 is mounted to a motherboard, for instance, with the semiconductor chip 5 and the optical chip 6 packaged in batch. Thus, the multichip unit 1 has the advantage of reducing the number of times of alignment having been required for individual packaging of the semiconductor chip and the optical chip, and of further increasing the yield in manufacture.

Further, in the multichip unit 1, the optical chip 6 is buried in the resin layer 7 so as to ensure that the surface 6a of the optical chip 6 coincides with the second surface 7b of the resin layer 7, so that the optical interconnect core 16 and the connection vias 17 or the like in the optoelectric interconnect layer 3 on the second surface 7b of the resin layer 7 may be provided at accuracy.

Figure 2:
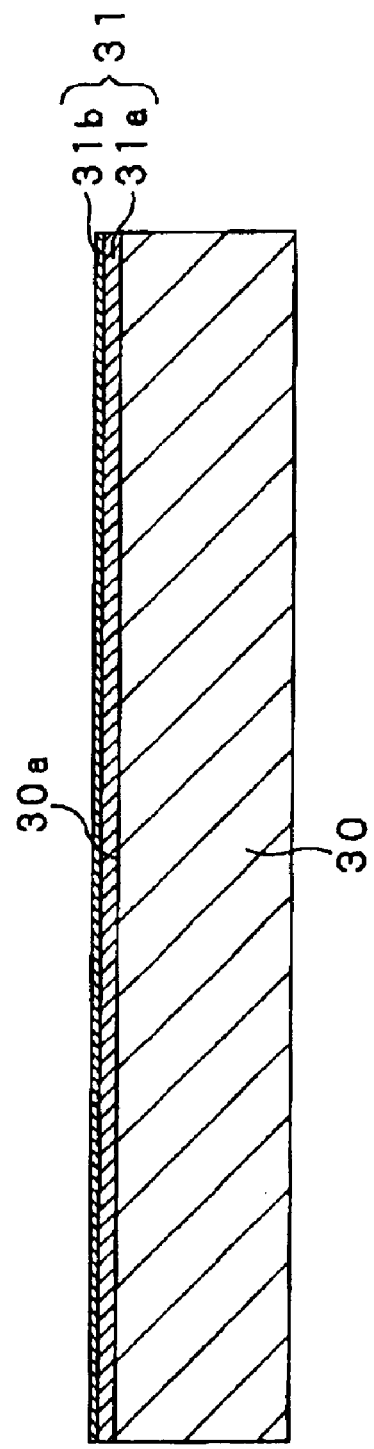
FIG. 2 is a schematic cross-sectional view showing a dummy substrate, for describing a method of manufacturing the multichip unit according to a preferred embodiment of the present invention.

A method for manufacturing the above multichip unit 1 will be next described. In manufacture of the multichip unit 1, the multichip module 2 is to be firstly fabricated. In fabrication of the multichip module 2, the dummy substrate 30 having the release layer 31 on the surface 30a thereof is prepared, as shown in FIG. 2. The dummy substrate 30 employs a high heat-resistant substrate having a flat surface obtained by planarization to a high degree, and a glass substrate, a quarts substrate and a Su substrate or the like is available. The release layer 31 is composed of a metal film 31a and a resin film 31b. Specifically, the metal film 31a is deposited with copper, aluminum or the like of a uniform thickness as thin as about 1000 Å over the whole surface 30a of the dummy substrate 30 using a thin film deposition technology such as sputtering and chemical vapor deposition (CVD), for instance. The resin film 31b is deposited with polyimide resin or the like of a thickness as thin as about 1 $\mu$m to 2 $\mu$m over the whole surface of the metal film 31a by spin coating or the like.

Figure 3:
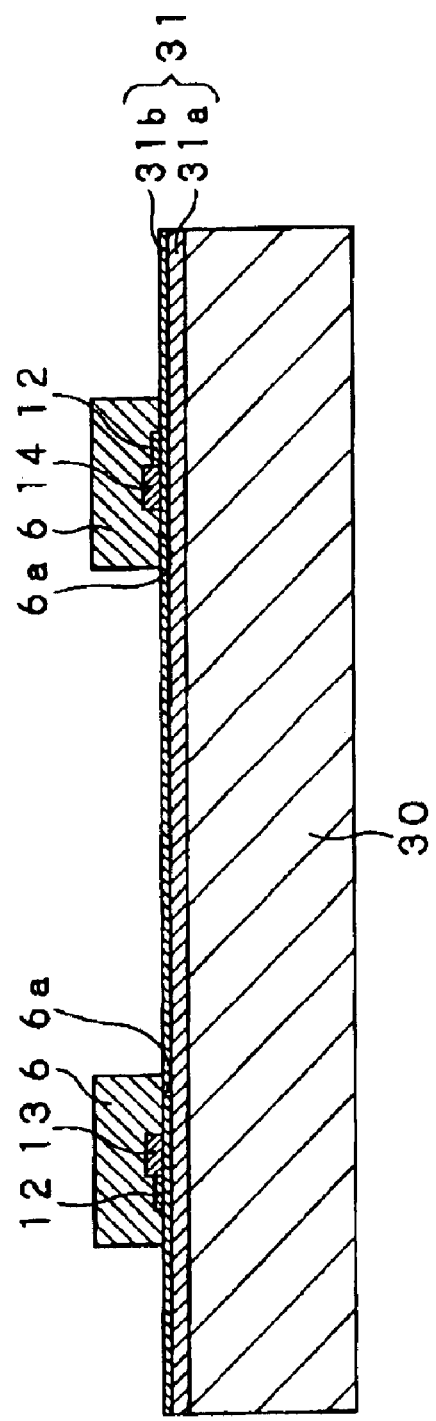
FIG. 3 is a schematic cross-sectional view showing an optical chip disposed on the dummy substrate, for describing the method of manufacturing the multichip unit according to a preferred embodiment of the present invention.

Next, the optical chip 6 is placed at a given position on the release layer 31, as shown in FIG. 3. In this process, the optical chip 6 is to be placed so as to ensure that the surface 6a mounted with the light emitting section 13 or the photo detecting section 14 faces the release layer 31. The release layer 31 adapted to placement of the optical chip 6 preferably needs to have a certain degree of stickiness so as to make the placed optical chip 6 fixed in position.

Figure 4:
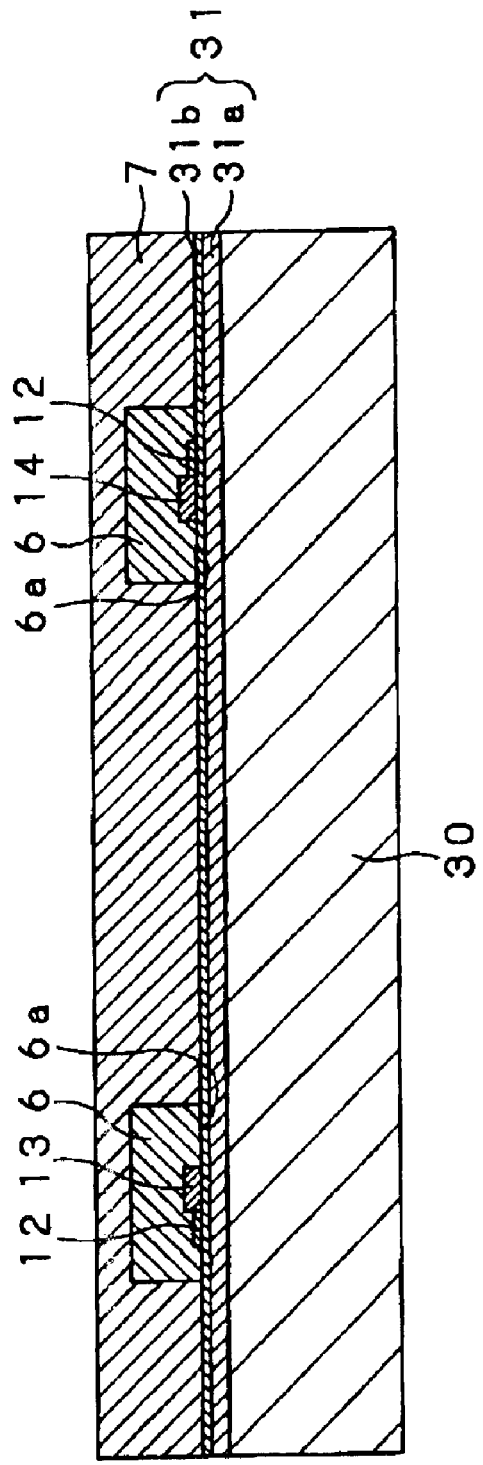
FIG. 4 is a schematic cross-sectional view showing a resin layer formed on the dummy substrate, for describing the method of manufacturing the multichip unit according to a preferred embodiment of the present invention.

Next, the resin layer 7 is deposited on the release layer 31 so as to cover the optical chip 6, as shown in FIG. 4. The resin layer 7 is formed with the above insulating material typically prevailing in a conventional circuit board fabrication process, for instance. Specifically, the resin layer 7 is formed by deposition in such a way as to coat a liquefied insulating material on the release layer 31 using a method such as spin coating, curtain coating, roll coating and dip coating, for instance.

Figure 5:
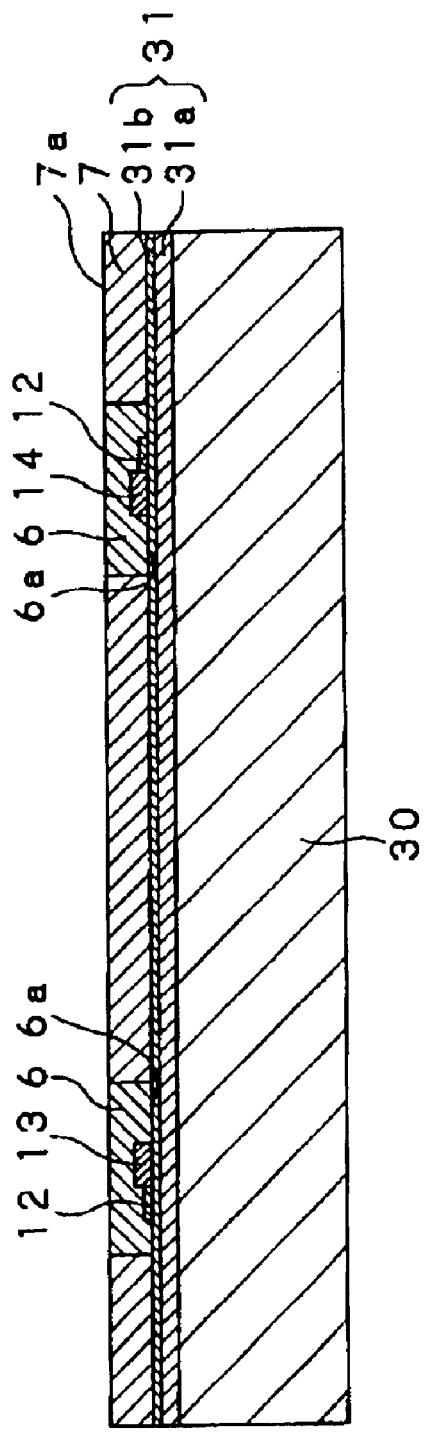
FIG. 5 is a schematic cross-sectional view showing the resin layer and the optical chip after polishing process, for describing the method of manufacturing the multichip unit according to a preferred embodiment of the present invention.

Next, the resin layer 7 is subjected to polishing using a method such as back grinding and chemical-mechanical polishing (CMP), for instance, as shown in FIG. 5. In this process, the resin layer 7 is to be polished until at least a surface 6b opposite to the surface 6a of the optical chip 6 is bared. With this polishing, the resin layer 7 is thinned up to a given thickness, and the polished surface thereof results in an accurately planarized surface that forms the first surface 7a.

Figure 6:
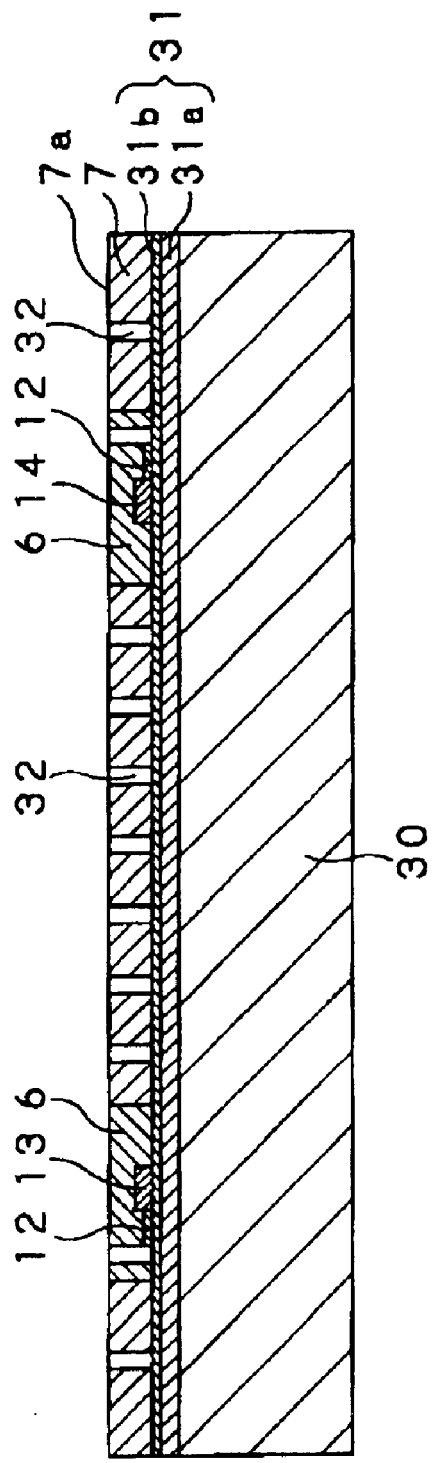
FIG. 6 is a schematic cross-sectional view showing the resin layer and the optical chip having an opening formed, for describing the method of manufacturing the multichip unit according to a preferred embodiment of the present invention.

Next, openings 32 configuring the interlayer vias 10 are formed by patterning at given positions of the resin layer 7, as shown in FIG. 6. When the resin layer 7 formed with a photosensitive insulating material is employed, the openings 32 are to be formed by patterning using photolithography, for instance. Alternatively, when the resin layer 7 formed with a non-photosensitive insulating material is employed, the openings 32 are to be formed by patterning using dry etching or laser machining with a mask of photo resist, aluminum, for instance.

The opening 32 is also formed in the optical chip 6, similarly to the resin layer 7. In this process, the opening 32 is to be formed in the optical chip 6 so as to border on the terminal section 12.

Figure 7:
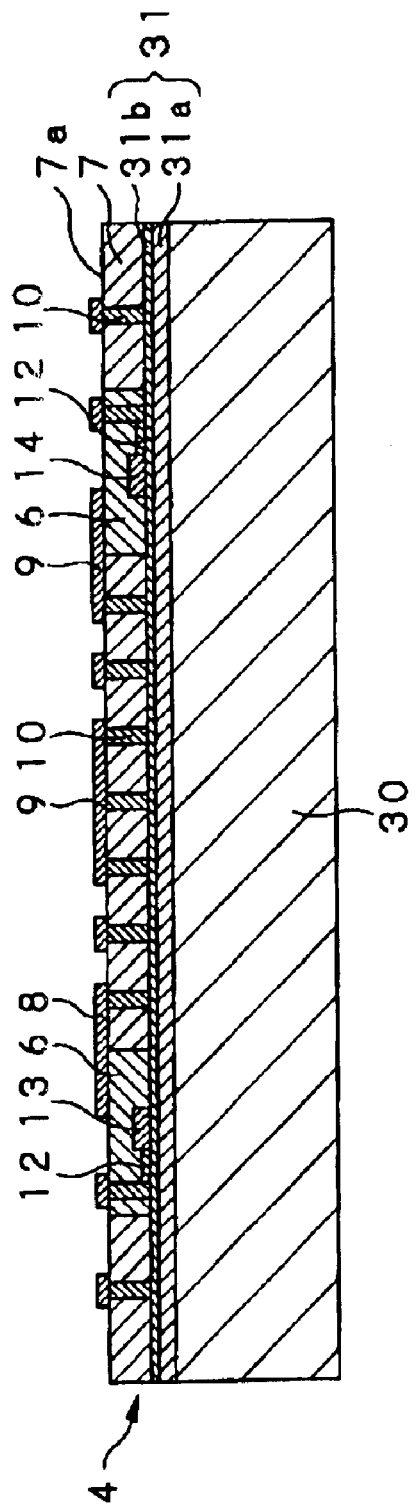
FIG. 7 is a schematic cross-sectional view showing patterned interconnects and connecting lands formed on the first surface of the resin layer, for describing the method of manufacturing the multichip unit according to a preferred embodiment of the present invention.

Next, the patterned interconnect 8 is formed by patterning on the first surface 7a of the resin layer 7 using a semi-additive or full-additive method, for instance, as shown in FIG. 7. Alternatively, patterning may be also to form the patterned interconnect 8 by depositing a metal film of conductive metal such as copper and aluminum, for instance, before patterning by etching or the like into a desired shape. In this process, the connection lands 9, to which the connection terminals 5a of the semiconductor chip 5 are bonded, are also to be formed simultaneously by patterning in a section of the patterned interconnect 8. In addition, the interlayer vias 10 are also to be opened together with the patterned interconnect 8. Alternatively, it is also allowable to plate the connection lands 9 with metal such as gold and tin, for instance, so as to ensure appropriate connection to the connection terminals 5a of the semiconductor chip 5. As described above, the circuit section 4 with the optical chip 6 buried in the resin layer 7 is fabricated.

Figure 8:
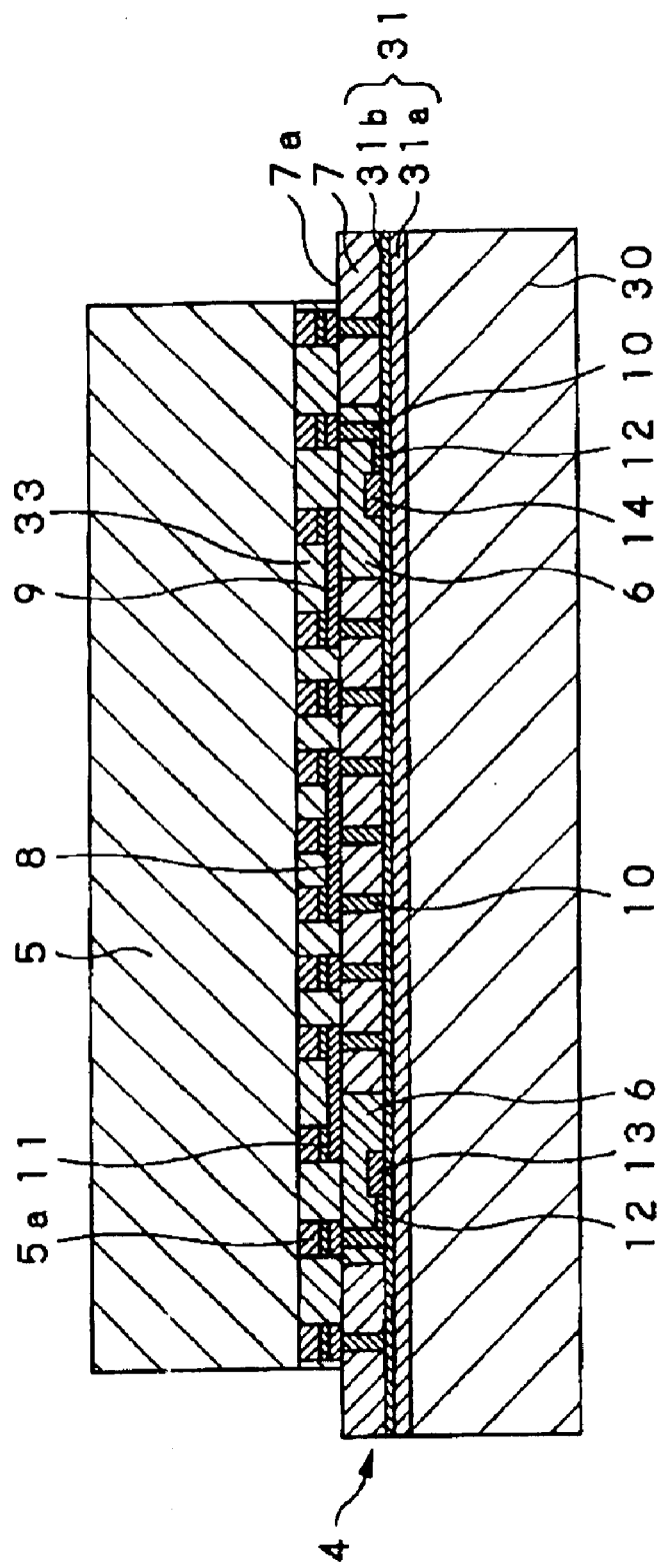
FIG. 8 is a schematic cross-sectional view showing a semiconductor chip mounted on the first surface of the resin layer, for describing the method of manufacturing the multichip unit according to a preferred embodiment of the present invention.

Next, the semiconductor chip 5 is mounted on the first surface 7a of the resin layer 7, as shown in FIG. 8. Specifically, the semiconductor chip 5 is subjected to deposition of the connection bumps 11 on the connection terminals 5a, before being mounted on the first surface 7a of the resin layer 7 in such a way that the connection bumps 11 are bonded to the connection lands 9 by face-down bonding such as under-fill bonding, tape automated bonding (TAB) and beam lead bonding. When the under-fill bonding is employed, for instance, a resin member 33 is filled in between the semiconductor chip 5 and the resin layer 7 to ensure that the connection terminals 5a of the semiconductor chip 5 are properly bonded to the connection lands 9 in such a way as to press the connection terminals 5a and the connection lands 9 against each other under the action of shrinkage resulting from hardening of the filled resin member 33. It is noted that the present invention is by no means limited in mounting of the semiconductor chip 5 to the resin layer 7 to the above face-down bonding, and flip chip bonding, for instance, is also applicable.

Figure 9:
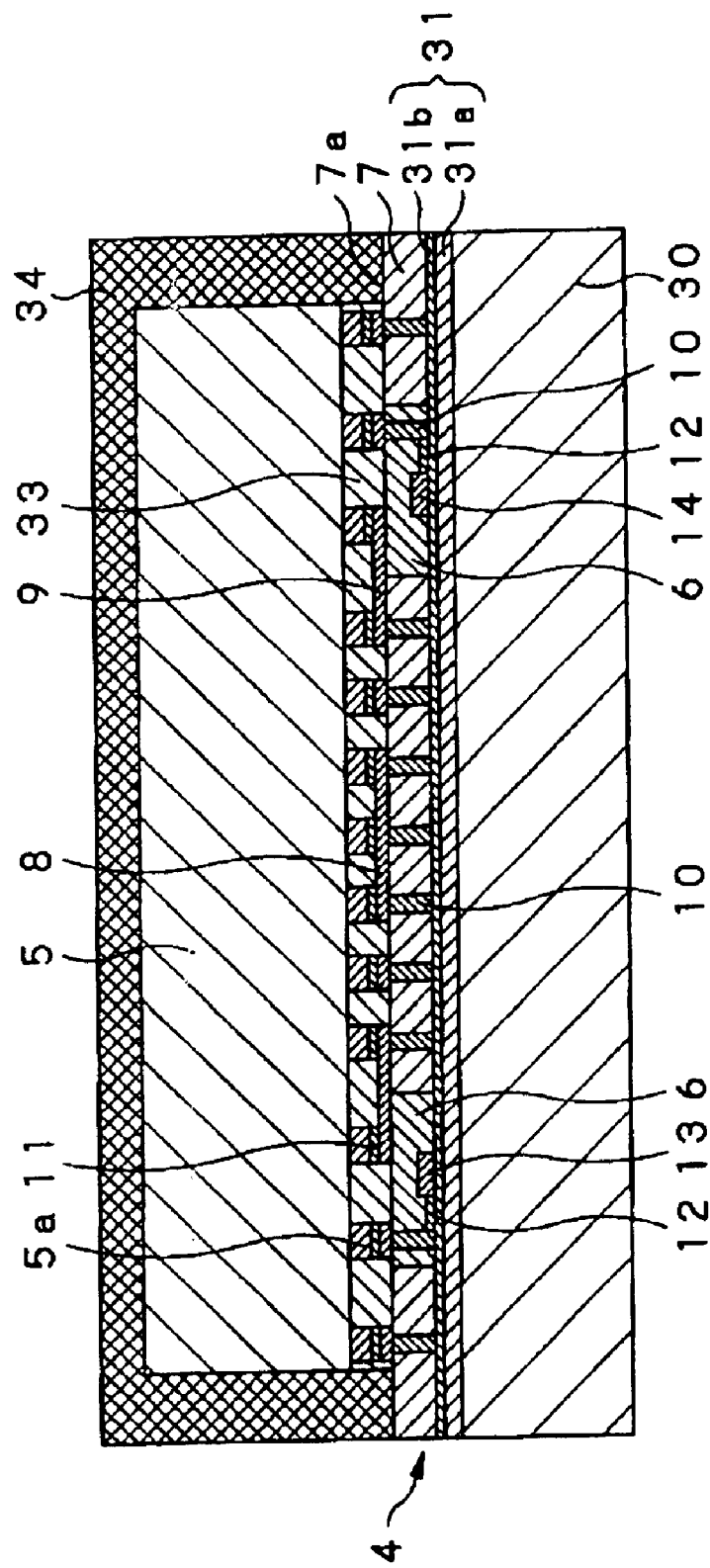
FIG. 9 is a schematic cross-sectional view showing the semiconductor chip covered with a passivation layer, for describing the method of manufacturing the multichip unit according to a preferred embodiment of the present invention.

Next, a passivation 34 is deposited on the first surface 7a of the resin layer 7 so as to cover the mounted semiconductor chip 5, as shown in FIG. 9. The passivation 34 is to be deposited over the whole first surface 7a of the resin layer 7 in such a way that a resin is filled to cover the circumference of the semiconductor chip using a method such as transfer molding and printing, for instance. The passivation 34 is formed with a material such as epoxy resin, for instance, that yields a small shrinkage when being thermally hardened. Thus, in the resin layer 7, the passivation 34 may be prevented from being warped or deformed due to shrinkage resulting from thermal hardening. Alternatively, it is also allowable to provide the passivation 34 containing silica filler for increased mechanical strength.

Figure 10:
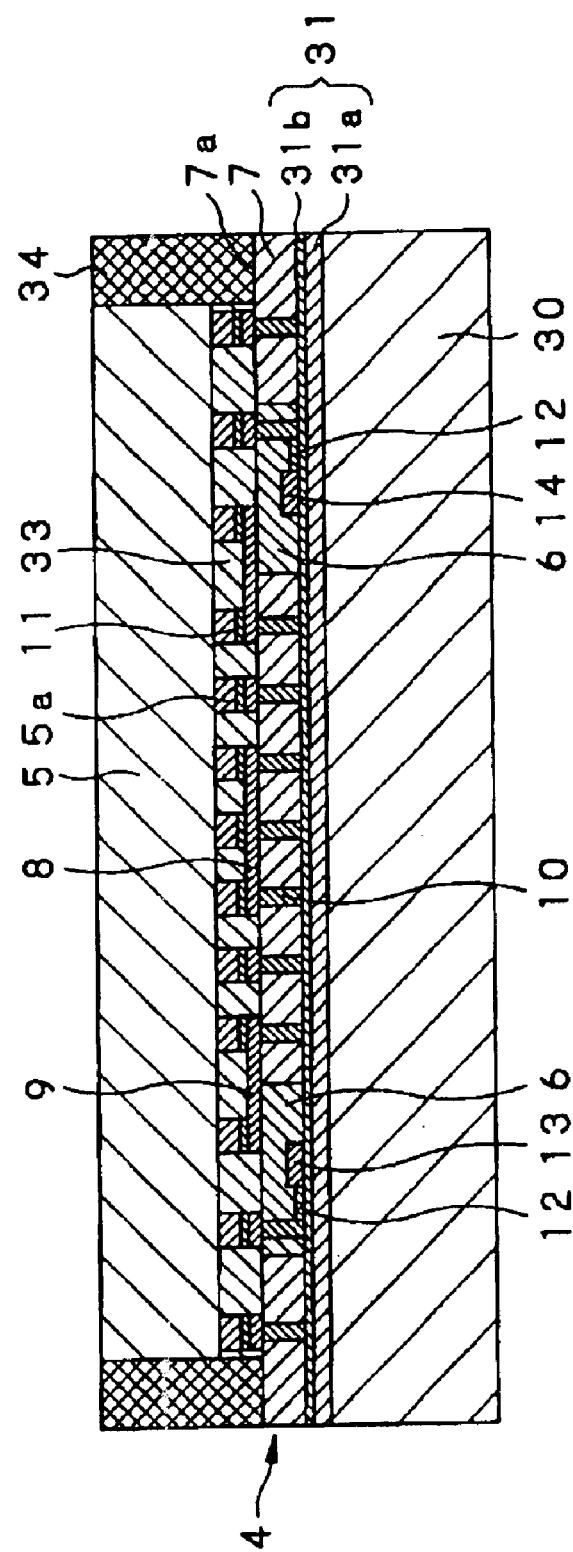
FIG. 10 is a schematic cross-sectional view showing the semiconductor chip and passivation layer after polishing process, for describing the method of manufacturing the multichip unit according to a preferred embodiment of the present invention.

Next, the semiconductor chip 5 and the passivation 34 are subjected to polishing, as shown in FIG. 10. In this process, polishing such as mechanical polishing with a grinder, chemical polishing by wet etching and chemical-mechanical polishing (CMP) realized using the mechanical polishing in combination with the chemical polishing, for instance, is employed, and the semiconductor chip 5 is to be polished, together with the passivation 34, to the limit of a thickness that causes no damage to functions thereof. The above polishing takes place with the dummy substrate 30 as a support substrate for the semiconductor chip 5 and the passivation 34 in such a way as to bury the passivation 34 around the semiconductor chip 5 in a direction of the polished surface without producing a difference in level between the semiconductor chip 5 and the passivation 34. Thus, the semiconductor chip 5 and the passivation 34 may be polished, while the edge of the semiconductor chip 5 is prevented from being chipped off.

Figure 11:
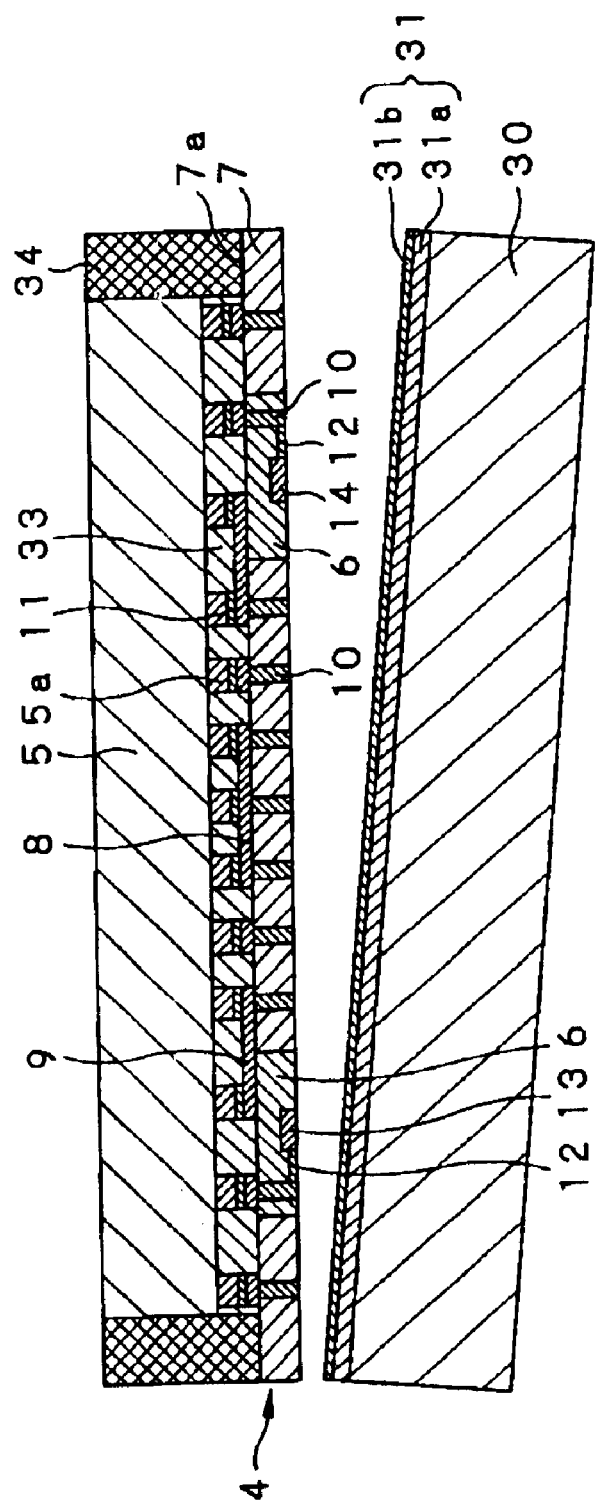
FIG. 11 is a schematic cross-sectional view showing a status after the dummy substrate is removed, for describing the method of manufacturing the multichip unit according to a preferred embodiment of the present invention.

Next, the dummy substrate 30 is removed together with the release layer 31 from the second surface 7b of the resin layer 7, as shown in FIG. 11. Specifically, the dummy substrate 30 and the release layer 31 are immersed into an acid solution such as hydrochloric acid and nitric acid, for instance, to ensure that the acid solution penetrates in between the metal film 31a and the resin film 31b, while allowing the metal film 31a of the release layer 31 to be slightly dissolved. With this process, separation between the metal film 31a and the resin film 31b is advanced, and as a result, the dummy substrate 30 is removed from the resin layer 7 with the resin film 31b left on the second surface 7b of the resin layer 7. Alternatively, it is also allowable to employ laser ablation, for instance, to strip the dummy substrate 30 from the resin layer 7.

Next, the resin film 31b left on the second surface 7b of the resin layer 7 is removed by dry etching and the like with oxygen plasma, for instance. With this process, an end of each interlayer via 10 is bared to the outside through the second surface 7b of the resin layer 7. In addition, the second surface 7b of the resin layer 7 becomes flush with the surface 6a of the optical chip 6 to ensure that the light emitting section 13 and the photo detecting section 14 in the optical chips 6 are bared to the outside. Because of use of the dummy substrate 30 having the accurately planarized surface 30a at the side confronting the second surface 7b of the resin layer 7, the resin layer 7 permits that the second surface 7b thereof is accurately planarized. It is noted that the dummy substrate 30 is to be reused at need.

Figure 12:
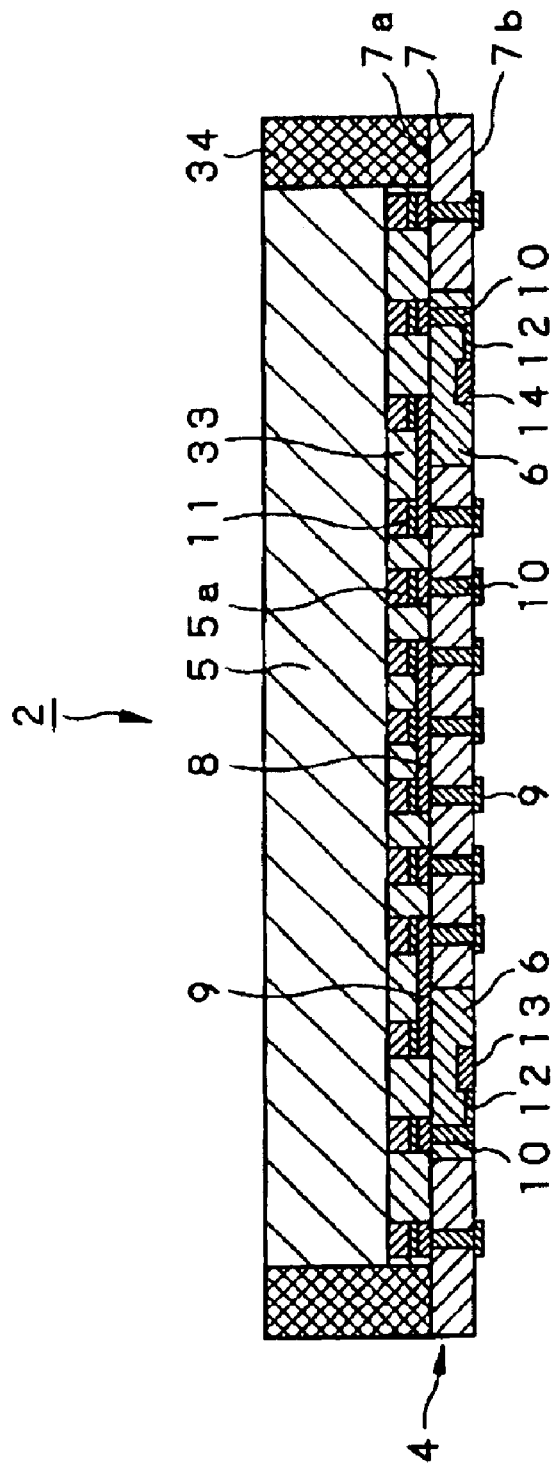
FIG. 12 is a schematic cross-sectional view showing a finished multichip module, for describing the method of manufacturing the multichip unit according to a preferred embodiment of the present invention.

Next, the connection lands 9 are deposited on the second surface 7b of the resin layer 7, as shown in FIG. 12. The connection lands 9 are formed with conductive metal such as copper, gold and tin using the thin film deposition technology, for instance, so as to cover a bared end face of each interlayer via 10 on the second surface 7b of the resin layer 7. As described above, the chip size-packaged multichip module 2 with the semiconductor chip 5 and the optical chip 6 packaged is fabricated.

Figure 13:
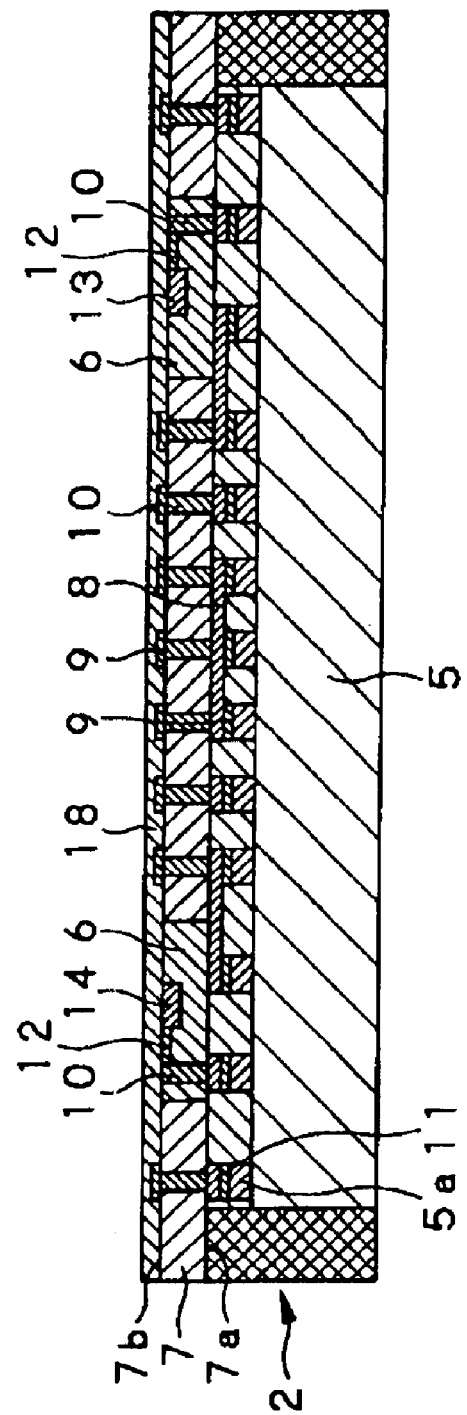
FIG. 13 is a schematic cross-sectional view showing the multichip unit having a bottom cladding layer formed on the multichip module, for describing the method of manufacturing the multichip unit according to a preferred embodiment of the present invention.

Next, the optoelectric interconnect layer 3 is fabricated. In fabrication of the optoelectric interconnect layer 3, the lower cladding layer 18 is to be deposited on the second surface 7b of the resin layer 7 in the multichip module 2 by turning the multichip module 2 upside down in a thickness direction, as shown in FIG. 13. The lower cladding layer 18 is formed by deposition in such a way as to coat a liquefied polymer resin material on the second surface 7b of the resin layer 7 using a method such as spin coating, curtain coating, roll coating and dip coating, similarly to the above resin layer 7.

Figure 14:
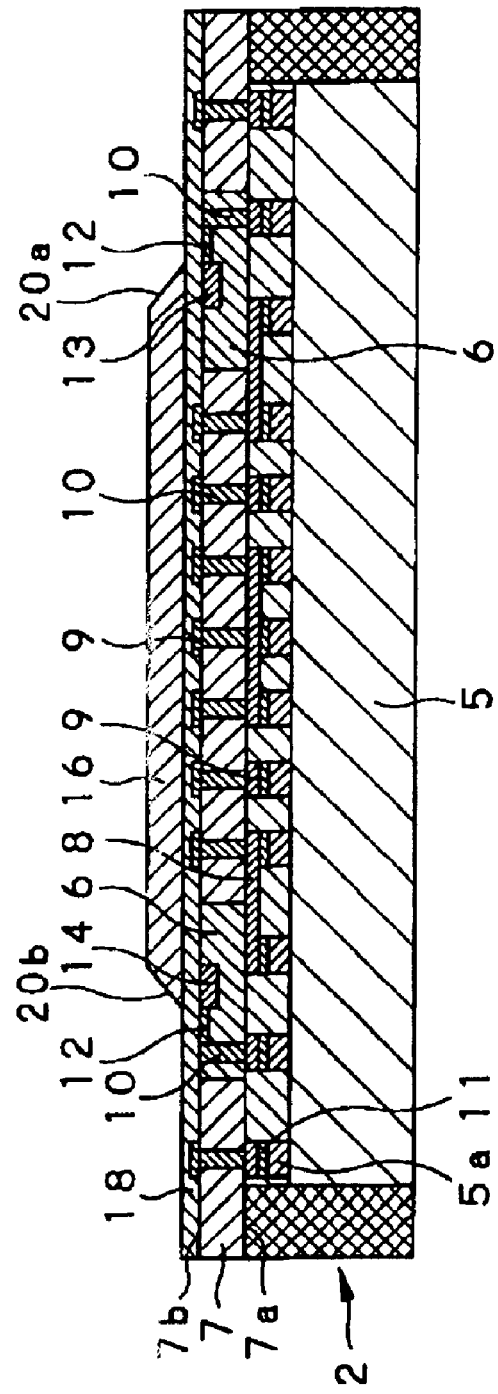
FIG. 14 is a schematic cross-sectional view showing an optical inteconnect core formed formed on the bottom cladding layer, for describing the method of manufacturing the multichip unit according to a preferred embodiment of the present invention.

Next, the optical interconnect core 16 is deposited on the lower cladding layer 18, as shown in FIG. 14. The optical interconnect core 16 is formed by patterning in such a way as to coat a liquefied resin material having a refractive index larger than that of the resin material used for the lower cladding layer 18 in a given shape by screen printing, for instance. In addition, the mirror sections 20a and 20b formed with metal such as gold and aluminum, for instance, are also arranged at the opposite ends of the optical interconnect core 16.

Figure 15:
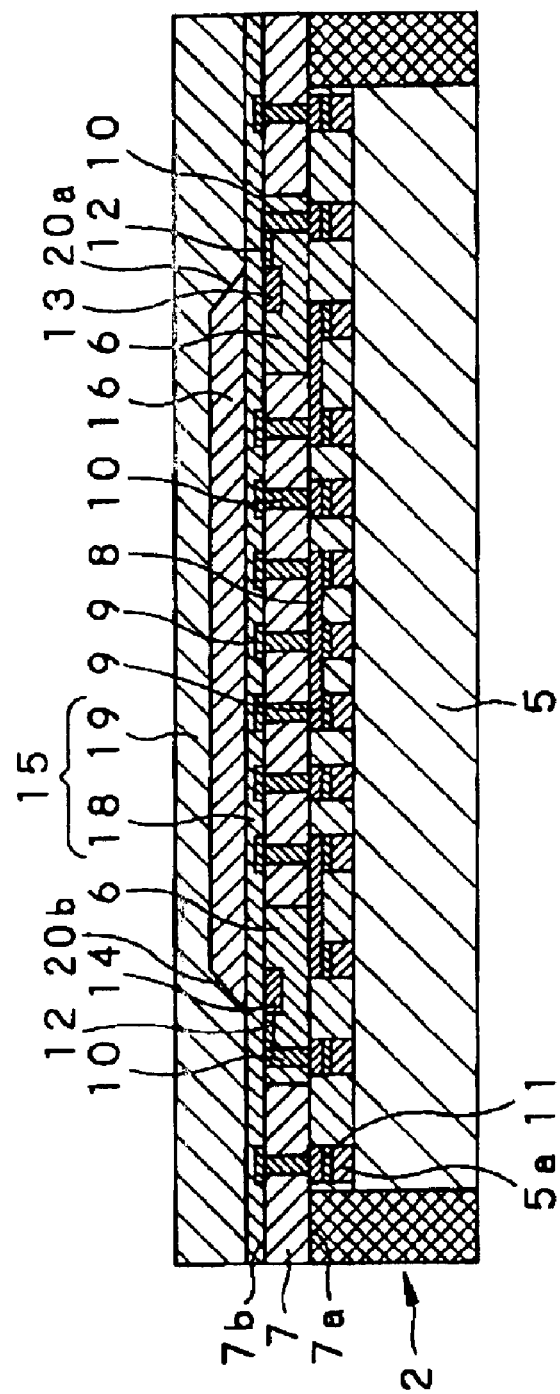
FIG. 15 is a schematic cross-sectional showing an upper cladding layer formed on the bottom cladding layer, for describing the method of manufacturing the multichip unit according to a preferred embodiment of the present invention.

Next, the upper cladding layer 19 is deposited on the lower cladding layer 18 so as to cover the patterned optical interconnect core 16, as shown in FIG. 15. The same material and process as those of the lower cladding layer 18 are applied to deposition of the upper cladding layer 19. Thus, the cladding layer 15 composed of the lower cladding layer 18 and the upper cladding layer 19 is configured as the base of the optoelectric interconnect layer 3. In addition, the optical interconnect core 16 is enclosed with the cladding layer 15 formed with the resin material of a smaller refractive index, and is thus applicable to the optical wave-guide that is effective in propagation of the photo signal to be guided due to total reflection.

Figure 16:
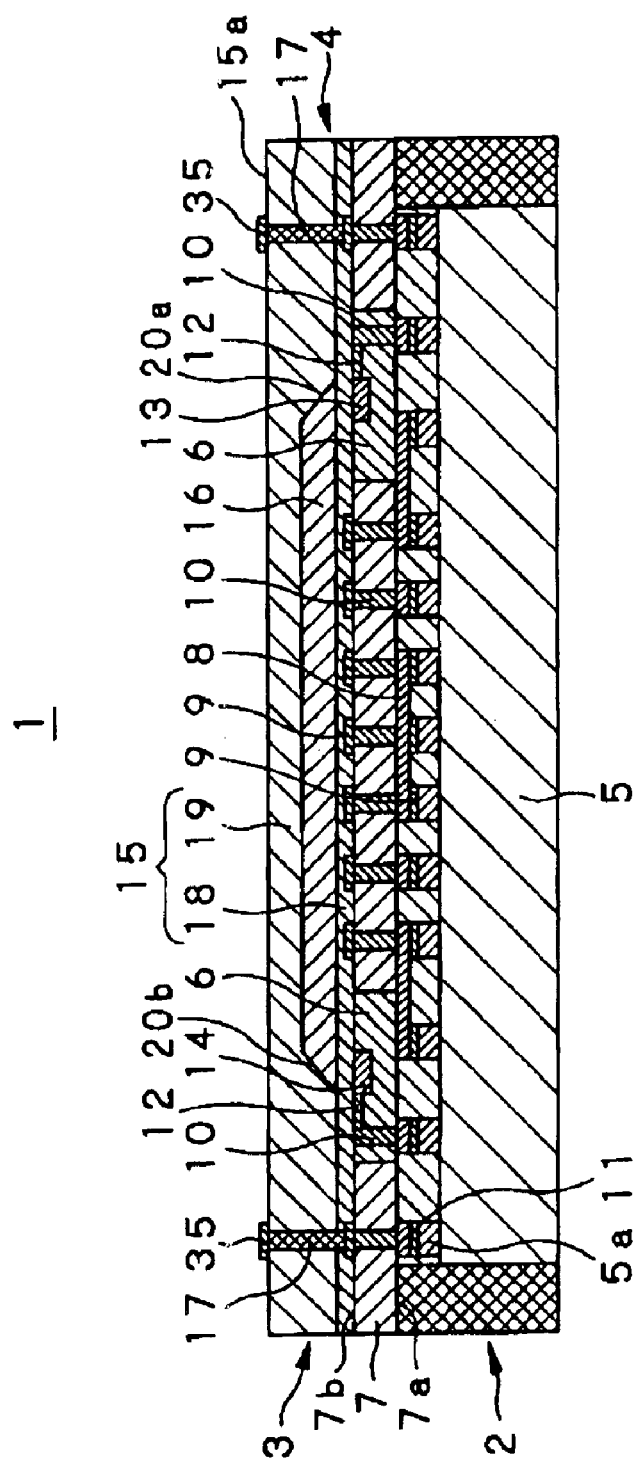
FIG. 16 is a schematic cross-sectional view showing a finished multichip unit, for describing the method of manufacturing the multichip unit according to a preferred embodiment of the present invention.

Next, the connection vias 17 connected to the connection lands 9 on the second surface 7b of the resin layer 7 in the multichip module 2 are opened in the cladding layer 15 so as to extend through the cladding layer 15 in a thickness direction, as shown in FIG. 16. The same material and process as those of the above interlayer vias 10 are also applied to opening of the connection vias 17. Then, input/output terminal sections 35 configuring electric signal or power feed sections to the outside when the multichip unit 1 is mounted to the motherboard, for instance, are formed on the surface 15a opposite to the confronting surface of the cladding layer 15 to the multichip module 2 so as to cover the ends of the bared connection vias 17. Then, the optoelectric interconnect layer 3 is fabricated on the multichip module 2, thereby providing the multichip unit 1.

According to the above method for manufacturing the multichip unit 1, the optical interconnect core 16 adapted to optical connection between the optical chips 6 of the multichip module 2 is placed at the side of the optoelectric interconnect layer 3, unlike the hybrid placement of the pattern interconnect 8 and the optical interconnect core 16 at the side of the multichip module, so that there is an advantage of providing the multichip unit 1 that attains the simplified placement and routing of each interconnect to permit satisfactory yield.

In addition, according to the above manufacturing method, the multichip module 2 permits that the interlayer connection between the semiconductor chip 5 and the optical chip 6 is attained through the interlayer vias 10 and that these chips may be electrically connected together over an extremely short distance, so that there is an advantage of providing the multichip module 2 that attains reduced parasitic capacitance between the semiconductor chip 5 and the optical chip 6.

Figure 17:
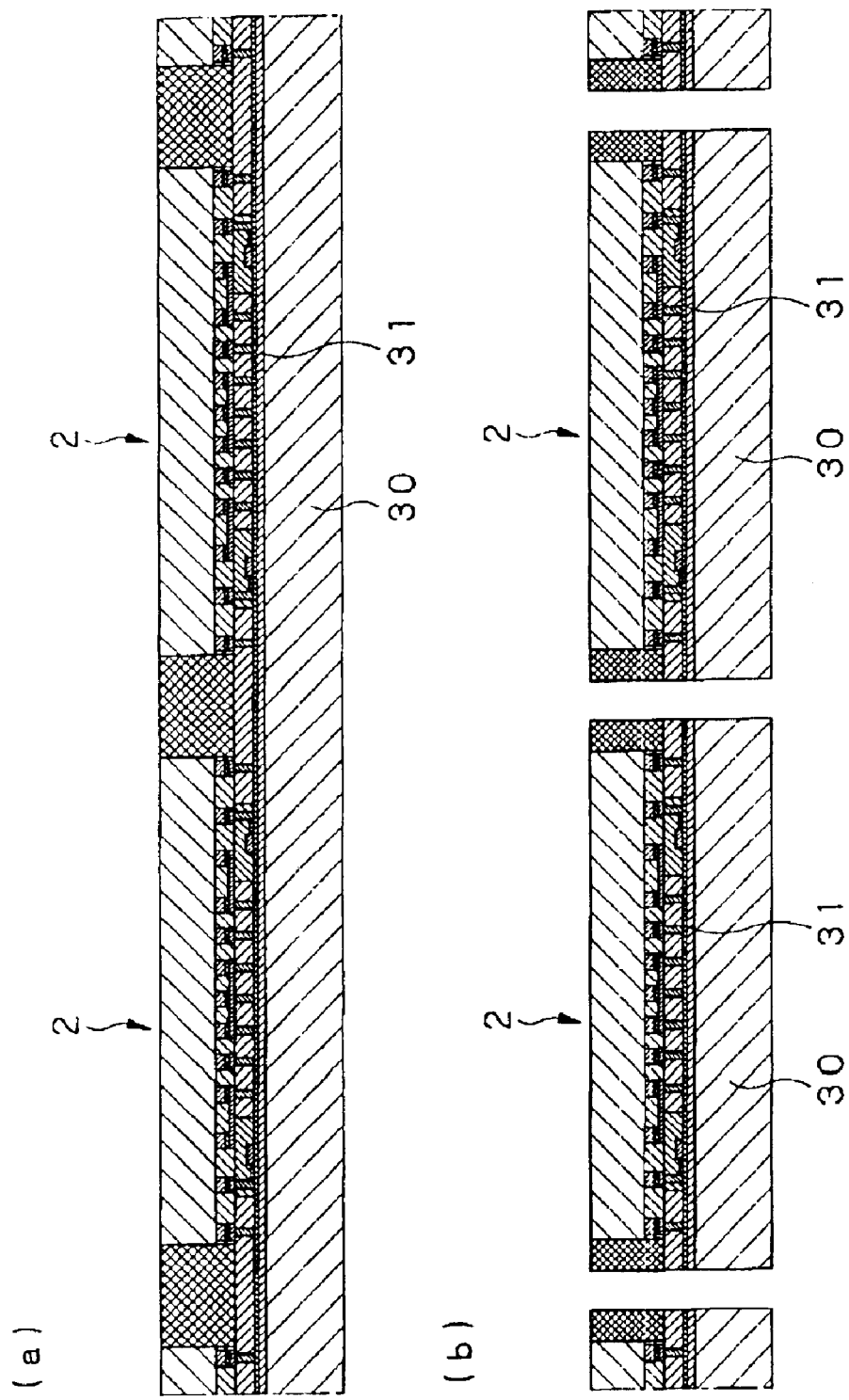
FIG. 17(a) and (b) are schematic cross-sectional views for describing the manufacture of a plurality of multichip modules, wherein FIG. 17(a) describes a plurality of multichip modules formed on the dummy substrate and FIG. 17(b) describes the plurality of multichip modules formed on the dummy substrate and divided, according to a preferred embodiment of the present invention.

The above manufacturing method of the multichip unit 1 has been described by taking a case of fabrication of a single multichip module 2 at one time. However, the present invention is by no means limited to the above, and it is also allowable to provide a plurality of multichip modules 2 in batch by cutting a continuum of a plurality of multichip modules 2 into the modules 2 at given positions after fabrication of the above continuum on a single dummy substrate 30, for instance, as shown in FIG. 17.

Figure 18:
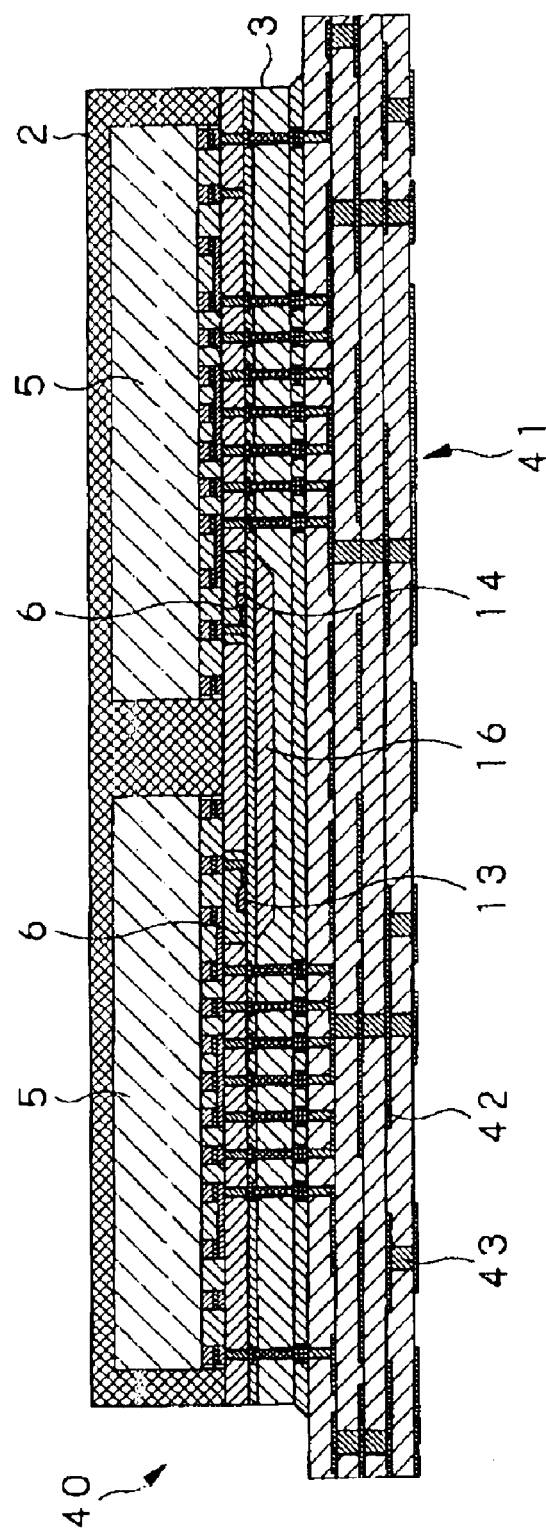
FIG. 18 is a schematic cross-sectional view showing another structure of multichip unit, in which a multichip unit having a plurality of semiconductor chips are mounted on a mother substrate, according to a preferred embodiment of the present invention.

In addition, the above embodiment has been described by taking a case of the multichip unit 1 configured so that the optical chips 6 respectively having the light emitting section 13 and the photo detecting section 14 and electrically connected to the single semiconductor chip 5 are optically connected together through the optical interconnect core 16. However, the present invention is by no means limited to the above, and the multichip module may be also modified so that the optical chips 6 respectively assigned to a plurality of semiconductor chips 5 are optically connected together through the optical interconnect core 16, like a multichip unit 40 shown in FIG. 18.

The multichip unit 40 may be mounted using flip chip bonding or the like to a motherboard 41 or the like fabricated through a typical multi-layer circuit board fabrication process, for instance. With this configuration, the multichip unit 40 permits that feed of the power and the electric signal or the like takes place through patterned interconnects 42 and vias 43 or the like respectively in layers of the motherboard 41.

Figure 19:
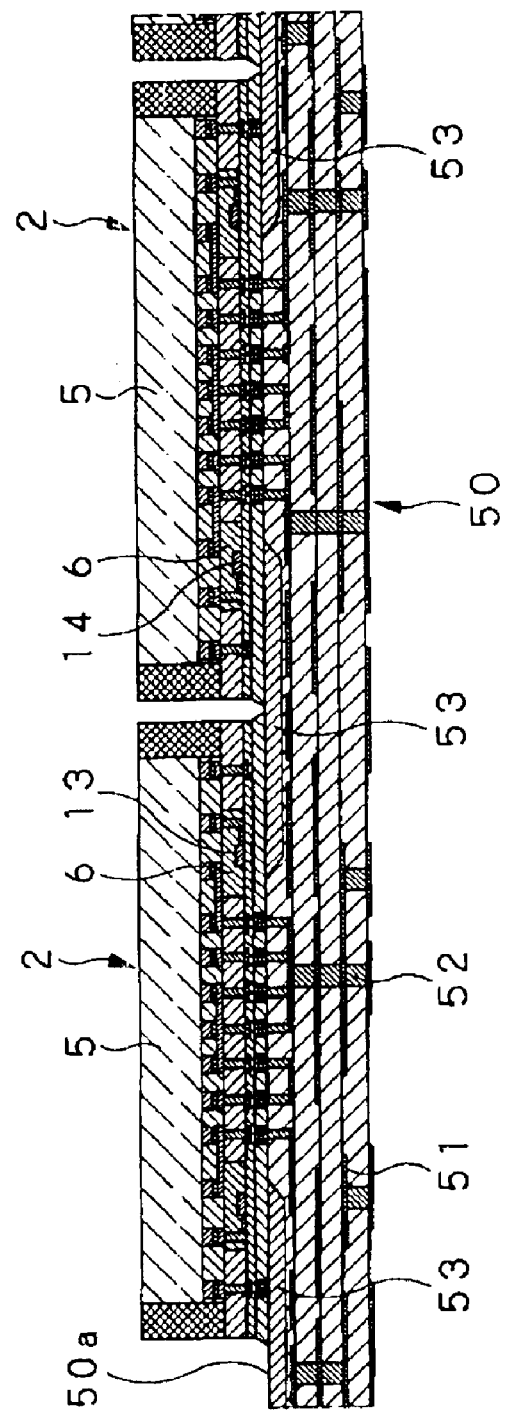
FIG. 19 is a schematic cross-sectional view showing the other structure having the plurality of multichips mounted in a surface of a hybridoptoelectric interconnect substrate, according to a preferred embodiment of the present invention.

Further, the above embodiment has been also described by taking a case of the multichip unit 1 configured so that the optical connection between the optical chips 6 in the multichip module 2 takes place through the optical interconnect core 16 provided in the optoelectric interconnect layer 3. However, the present invention is by no means limited to the above, and the multichip unit may be also modified so that the optical chips 6 are connected together by mounting the multichip module 2 on an optoelectric interconnect hybrid circuit 50 or the like, without using the optoelectric interconnect layer 3, for instance, as shown in FIG. 19.

In this case, the multichip module 2 permits that feed of the power and the electric signal to the semiconductor chip 5 takes place through electric interconnects such as patterned interconnects 51 and vias 52 provided in the optoelectric interconnect hybrid substrate 50, for instance. On the contrary, the optical connection between the optical chips 6 takes place through an optical interconnect core 53 provided in the optoelectric interconnect hybrid circuit 50, for instance. Alternatively, it is also allowable to mount a plurality of multichip modules 2 on a surface 50a of the optoelectric interconnect hybrid substrate 50 using flip chip bonding, for instance, as shown in FIG. 19.

Accordingly, although the present invention has been described hereinabove in its preferred form with a certain degree of particularity, many other changes, variations, combinations and sub-combinations are possible therein. It is therefore to be understood by those of ordinary skill in the art that any modifications will be practiced otherwise than as specifically described herein without departing from the scope and spirit of the present invention.

What is claimed is:

1. A multichip module comprising:
    a circuit section having an insulating layer, a patterned interconnect having connection lands formed on first and second surfaces of said insulating layer and an interlayer via for electrically interlayer connect said connection lands formed said first and second surfaces of said insulating layer;
    an electric chip having connection terminals connected to said connection lands, and mounted on said first surface of said insulating layer with said connection terminals connected to said connection lands for processing an electric signal inputted and/or outputted through said interlayer via; and
    an optical chip having a terminal section connected through said interlayer via to said connection land with said connection terminal connected thereto, having a light emitting section and/or a photo detecting section formed on a surface thereof and buried in said insulating layer with said surface coinciding with a second surface of said insulating layer so that said light emitting section and/or said photo detecting section is exposed on said second surface of said insulating layer.

2. The multichip module according to claim 1, wherein:
    said circuit section comprises said patterned interconnect formed on a surface of a plurality of said insulating layers which are stacked and said interlayer via interlaying said patterned interconnect;
    said electric chip is mounted on an uppermost layer among said stacked plurality of insulating layers; and
    said optical chip is buried in a lowermost layer among said stacked plurality of insulating layers.

3. The multichip module according to claim 1, wherein said optical chip is buried in a direction of thickness of said insulating layer and within a region of projection of said electric chip.

4. A multichip unit comprising:
    a multichip module comprising:
        a circuit section having an insulating layer, a patterned interconnect having connection lands formed on first and second surfaces of said insulating layer and an interlayer via for electrically interlayer connect said connection lands formed said first and second surfaces of said insulating layer;
        an electric chip having connection terminals connected to said connection lands, and mounted on the a surface of said insulating layer with said connection terminals connected to said connection lands for processing an electric signal inputted and/or outputted through said interlayer via; and
        an optical chip having a terminal section connected through said interlayer via to said connection land with said connection terminal connected thereto, having a light emitting section and/or a photo detecting section formed on a surface thereof and buried in said insulating layer with said surface coinciding with a second surface of said insulating layer so that said light emitting section and/or said photo detecting section is exposed on said second surface of said insulating layer; and
    anoptoelectrical interconnect layer comprising:
        an optical transmission line formed on a second surface of said insulating layer of said multichip module, for optically connecting said light emitting section and said photo detecting section exposed on said second surface of said insulating layer; and
        a via electrically connected with said connection land of said multichip module.

5. The multichip unit according to claim 4, wherein said optical transmission line of saidoptoelectrical interconnect layer comprises an optical wave-guide for making an optical signal generated in said emitting section reflect and propagate to said photo detecting section.

6. The multichip unit according to claim 4, wherein:
    said circuit section of said multichip module comprises said patterned interconnect formed on a surface of a plurality of said insulating layers which are stacked, and said interlayer via interlaying said patterned interconnect;
    said electric chip is mounted on an uppermost layer among said stacked plurality of insulating layers; and
    said optical chip is buried in a lowermost layer among said stacked plurality of insulating layers.

7. The multichip unit according to claim 4, wherein said optical chip is buried in a direction of thickness of said insulating layer and within a region of projection of said electric chip.

* * * * *